(12) United States Patent
Ni et al.

(10) Patent No.: US 10,772,203 B2
(45) Date of Patent: *Sep. 8, 2020

(54) FLAT DATA TRANSMISSION CABLE

(71) Applicant: ALLTOP ELECTRONICS (SUZHOU) LTD., Suzhou, Jiangsu Province (CN)

(72) Inventors: Mindi Ni, Suzhou (CN); Yichang Chen, New Taipei (TW)

(73) Assignee: ALLTOP ELECTRONICS (SUZHOU) LTD., Suzhou, Jiangsu Province (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/408,387

(22) Filed: May 9, 2019

(65) Prior Publication Data
US 2019/0371492 A1 Dec. 5, 2019

(30) Foreign Application Priority Data

Jun. 1, 2018 (CN) .......................... 2018 1 0556982
Oct. 24, 2018 (CN) ..................... 2018 2 1730509 U
Oct. 24, 2018 (CN) ..................... 2018 2 1732499 U

(51) Int. Cl.
| | |
|---|---|
| *H01B 7/08* | (2006.01) |
| *H05K 1/11* | (2006.01) |
| *H01R 12/53* | (2011.01) |
| *H01B 7/00* | (2006.01) |
| *H01B 7/02* | (2006.01) |
| *H01B 7/04* | (2006.01) |
| *H01B 7/22* | (2006.01) |
| *H01B 7/295* | (2006.01) |
| *H01B 11/00* | (2006.01) |

(Continued)

(52) U.S. Cl.
CPC .......... *H05K 1/111* (2013.01); *H01B 7/0054* (2013.01); *H01B 7/0208* (2013.01); *H01B 7/0225* (2013.01); *H01B 7/0241* (2013.01); *H01B 7/04* (2013.01); *H01B 7/0853* (2013.01); *H01B 7/205* (2013.01); *H01B 7/228* (2013.01); *H01B 7/295* (2013.01); *H01B 11/00* (2013.01); *H01B 11/203* (2013.01); *H01R 12/53* (2013.01); *H01B 7/0823* (2013.01); *H05K 1/117* (2013.01); *H05K 2201/094* (2013.01); *H05K 2201/09027* (2013.01); *H05K 2201/10356* (2013.01)

(58) Field of Classification Search
CPC ........................................................ H01B 7/08
USPC ....................................................... 174/117 F
See application file for complete search history.

(56) References Cited

U.S. PATENT DOCUMENTS 4,220,807 A * 9/1980 Anastasi .............. H01B 7/0233
   174/110 F
5,360,944 A * 11/1994 Springer .............. H01B 7/0838
   174/102 R (Continued)

*Primary Examiner* — Chau N Nguyen
(74) *Attorney, Agent, or Firm* — Cheng-Ju Chiang

(57) ABSTRACT

A flat data transmission cable includes a plurality of juxtaposed wires, a plastic layer enclosing on the wires integrally and a metallic layer formed by a metal material belt arranged on an outer side of the plastic layer in a spiral winding way, each wire has a conductor. The metallic layer has at least an aluminum foil layer and a bonding layer arranged on the side of the aluminum foil layer facing to the plastic layer, the metallic layer is bonded to the outer side of the plastic layer by the bonding layer.

17 Claims, 11 Drawing Sheets

(51) Int. Cl.
 *H01B 7/20* (2006.01)
 *H01B 11/20* (2006.01)

(56) References Cited

U.S. PATENT DOCUMENTS

| | | | |
|---|---|---|---|
| 8,975,521 B2* | 3/2015 | Huang | H01B 7/083 174/117 M |
| 2004/0026114 A1* | 2/2004 | Hsieh | H01B 7/0861 174/117 F |
| 2013/0000950 A1* | 1/2013 | Yamada | H01B 7/0823 174/117 F |
| 2016/0300642 A1* | 10/2016 | Kodama | H01B 3/307 |

* cited by examiner

FLAT DATA TRANSMISSION CABLE

CROSS REFERENCE TO RELATED APPLICATIONS

The present application claims the priority of Chinese Patent Application No. 201810556982.0 filed on Jun. 1, 2018, Chinese Patent Application No. 201821730509.1 filed on Oct. 24, 2018 and Chinese Patent Application No. 201821732499.5 filed on Oct. 24, 2018, the contents of which are hereby incorporated by reference into this application.

BACKGROUND

1. Technical Field

The present disclosure relates to a data transmission cable, and more particularly to a light and soft flat data transmission cable having better high frequency performance.

2. Description of Related Art

In the 3C industry, a transmission cable can be used as a medium for an electrical connection between two electronic devices and can carry out the expected signal transmission stably. Therefore, the transmission cable is widely used in various electronic devices. In particular, transmission cables connected with USB, HDMI, DVI, Displayport and other types of connector has a performance of higher transmission rate, longer transmission distance and higher quality, and is popular with consumers. The transmission cable usually has a plurality of wires including differential signal wires and grounding wires. Each wire is usually fixed to a metallic layer by an outer mylar layer, and there is air between the metallic layer and the wire, high frequency transmission performance of the wire may be affected. In addition, the thickness of the existing wire is increasingly difficult to meet the requirements of light and soft.

It is desirable to provide an improved data transmission cable for solving above problems.

SUMMARY

In one aspect, the present invention includes a data transmission cable comprising a plurality of juxtaposed wires, a plastic layer enclosing on the wires integrally and a metallic layer formed by a metal material belt arranged on an outer side of the plastic layer in a spiral winding way, each wire has a conductor. The metallic layer has at least an aluminum foil layer and a bonding layer arranged on the side of the aluminum foil layer facing to the plastic layer, the metallic layer is bonded to the outer side of the plastic layer by the bonding layer.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

The components in the drawing are not necessarily drawn to scale, the emphasis instead being placed upon clearly illustrating the principles of the described embodiments. In the drawings, reference numerals designate corresponding parts throughout various views, and all the views are schematic.

DETAILED DESCRIPTION OF THE ILLUSTRATED EMBODIMENT

Figure 1:
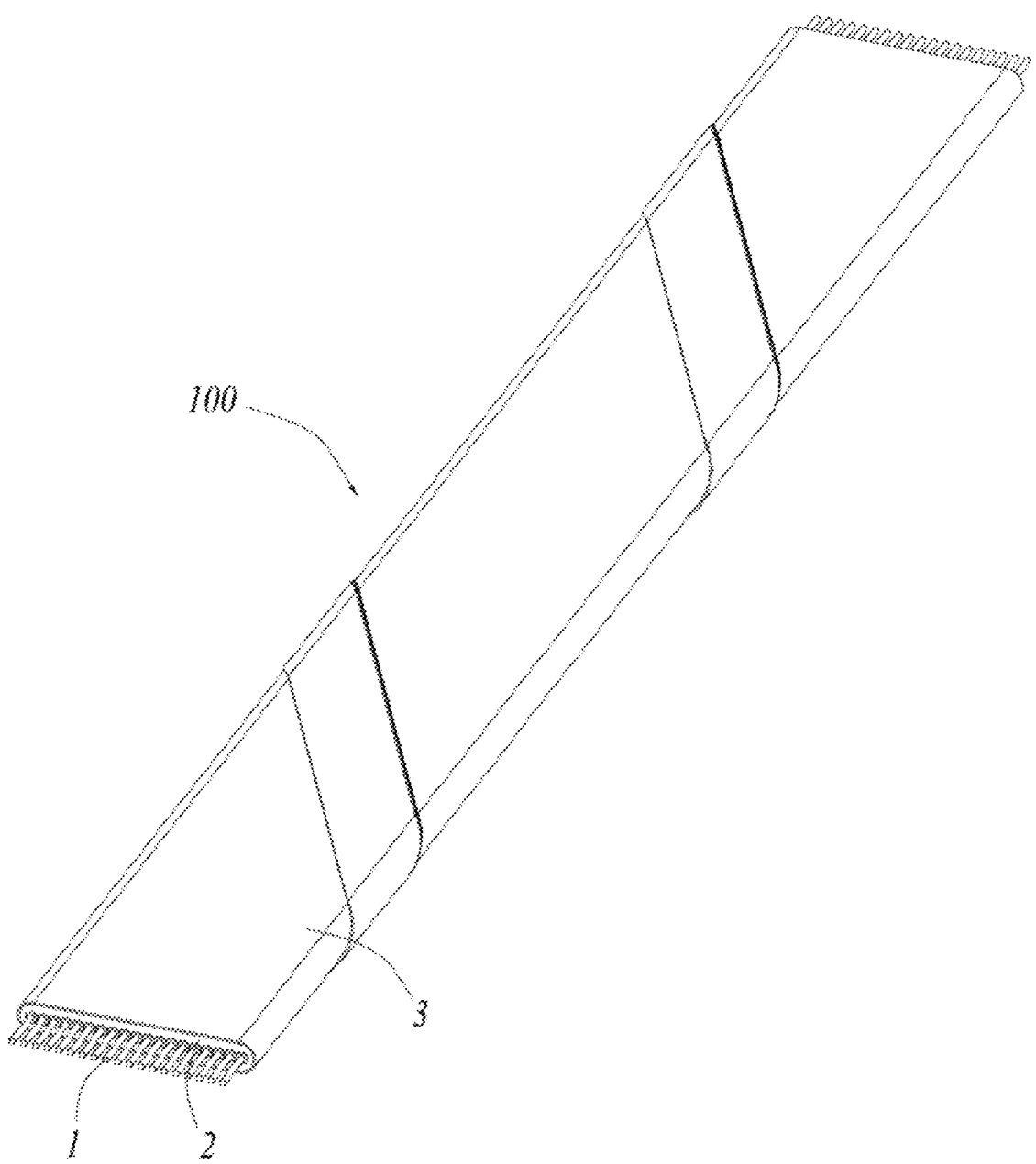
FIG. 1 is a perspective view of a data transmission cable before bending in accordance with a first embodiment of the present disclosure, showing a state of a metallic layer spiral winding thereon.

Reference will now be made to the drawing figures to describe the embodiments of the present disclosure in detail. In the following description, the same drawing reference numerals are used for the same elements in different drawings.

The present disclosure relates to a flat data transmission cable, and the data transmission cable comprises at least a plurality of juxtaposed wires and a plastic layer enclosing on the wires integrally, a detailed illustration of several preferred embodiments is as follow.

Figure 2:
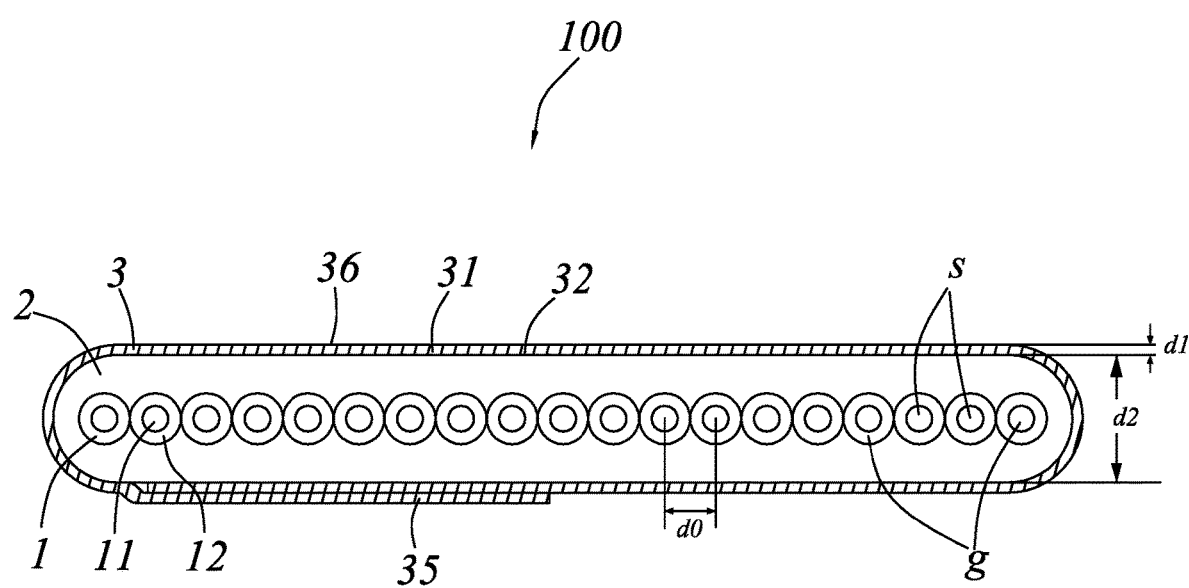
FIG. 2 is a front view of the data transmission cable shown in FIG. 1.
Figure 3:
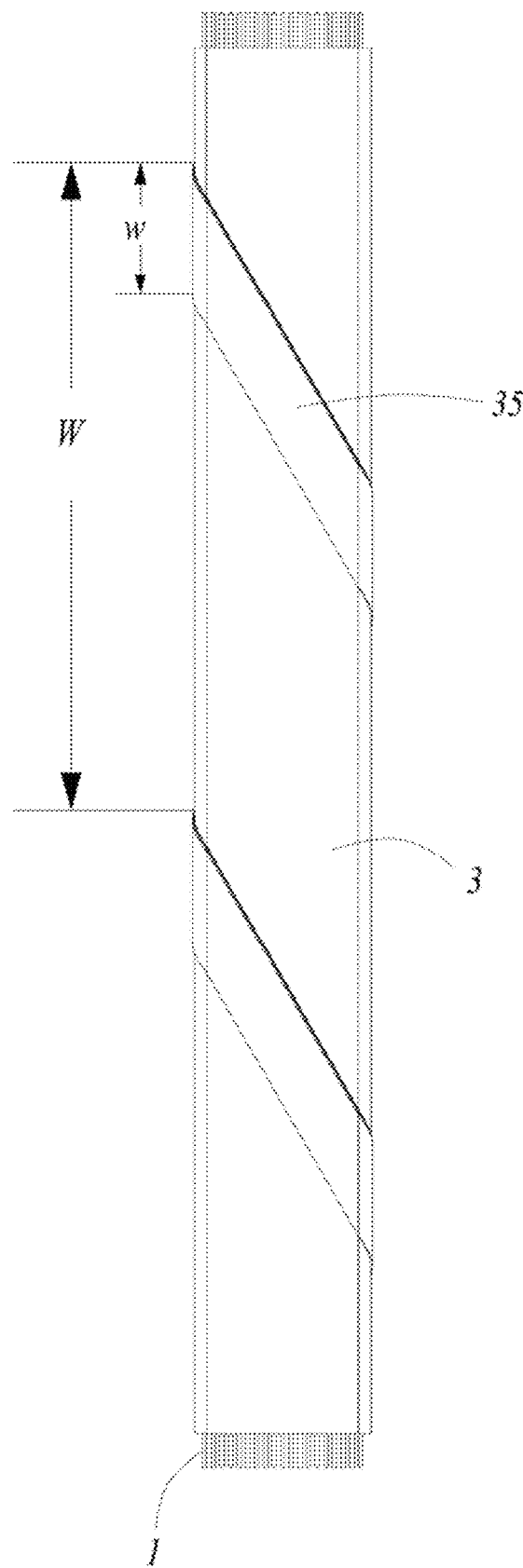
FIG. 3 is a top view of the data transmission cable shown in FIG. 1.

Referring to FIGS. 1 to 3, a first embodiment of the present disclosure discloses a data transmission cable 100, the data transmission cable 100 comprises a plurality of juxtaposed wires 1, a plastic layer 2 enclosing on the wires 1 integrally and a metallic layer 3 formed by a metal material belt arranged on an outer side of the plastic layer 2 in a spiral winding way.

In the present embodiment, each wire 1 has a conductor 11 and an insulative cladding layer 12 enclosing on the conductor 11. Central axes of the conductors 11 are located on a same plane, the plastic layer 2 is enclosing on the cladding layers 12 to form a common single insulation layer. The plastic layer 2 defines a top surface and a bottom surface parallel to the plane in which the central axes of the conductors 11 located. As the top surface of the plastic layer 2 parallel to the bottom surface, the arrangement of the conductors 11 can be effectively maintained for preventing distortion or folding. Furthermore, the winding arrangement of the metallic layer 3 can be further facilitated for avoiding air interlayer between the plastic layer 2 and the metallic layer 3.

The conductors 11 can be well protected by the cladding layer 12, thereby preventing short circuit caused by two adjacent conductors 11 contacting during the forming process of the plastic layer 2. Moreover, the thickness of the plastic layer 2 can also be set as light as possible when the wire 1 having the cladding layer 12, just making sure that the relative position of all wires 1, and then the thickness of the whole data transmission cable 100 can be reduced, thus the whole of data transmission cable 100 can be made much thinner and much softer.

The cladding layer 12 is made of same or similar material as the plastic layer 2, and preferably made of same kind material, thus when the data transmission cable 100 in the present invention is molded, the combination of the plastic layer 2 and the cladding layer 12 is better, and a good fusion can be achieved with minimizing the stratification problem or air entry, thus the forming effect is better.

Further, the same kind material is a polyhydrocarbon compound, and further, the polyhydrocarbon compound is preferably a high density polyethylene.

In addition, the plastic layer 2 and the cladding layer 12 can be preferably made of plastic material with a dielectric coefficient close to air, therefore the impedance of the cladding layer 12 and the plastic layer 2 can be reduced, and a better signal transmission environment can be provided for the conductors 11, the propagation delay of signals and crosstalk between signals can be reduced to ensure high-speed and effective transmission of signals and reduce signal attenuation.

When the wire 1 having the cladding layer 12, in the thickness direction of the data transmission cable 100, the distance between the outer edge of the conductor 11 and the outer edge of the plastic layer 2 is in the range of 0.1 mm to 0.45 mm, and preferably in the range of 0.15 mm to 0.25 mm. The above distance is also the distance between the conductor 11 and metallic layer 3, and one of the factors affecting the stable signal transmission of the wire 1, especially the high frequency data transmission. As the distance is smaller, the impedance is smaller and the high frequency performance is better. At the same time, the thickness of the whole data transmission cable 100 is smaller, and the data transmission cable 100 can be softer and thinner. However, if the thickness of the whole data transmission cable 100 is too small, the metallic layer 3 will affect signal transmission of the conductors 11, and the above-mentioned interval of the invention can better meet various requirements.

Figure 4:
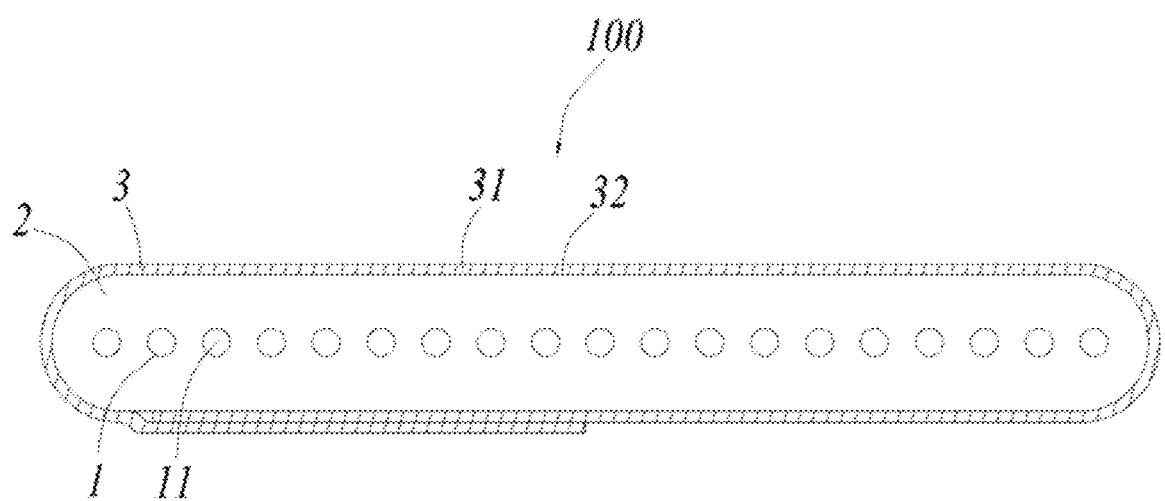
FIG. 4 is a front view of a data transmission cable in accordance with a second embodiment of the present disclosure.

A second embodiment of the present disclosure is disclosed in FIG. 4, each wire 1 also can have only the conductor 11 without the cladding layer 12, that is, the plastic layer 2 is directly enclosing on the wires 1, and the same effect can be achieved. By adopting the setting, the thickness of the plastic layer 2 can be further reduced, and the overall thickness of the data transmission cable 100 can be further reduced.

In further, the wires 1 are disposed in an equally spaced arrangement in present embodiment, and in the arrangement direction of the wires 1, the number of the wires 1 is in the range of 3 to 50. The wires 1 define at least two grounding wires and at least a signal wire between the two grounding wires. Therefore, the interference around the signal wire can be eliminated by grounding wire, and the signal transmission environment of the signal wire can be guaranteed, thereby improving the efficiency and stability of signal transmission.

As a preferred embodiment of the present invention, in order to meet the development needs of high-speed signal transmission, the number of the signal wires between two adjacent ground wires is preferably two. And the two signal wires constitute a signal wire group for transmitting differential signals, that is to say, the grounding wire is used for protecting the signal wire group to ensure the high frequency transmission performance.

Additionally, referring to FIG. 2, the wires 1 only comprise a plurality of grounding wires g and several signal wire groups s, and the number of grounding wires g is one more than that of the signal wire groups s. Preferably, in the arrangement direction of the wires 1, the two wires 1 on both sides are grounding wires g, and one signal wire group s is arranged between every two neighboring grounding wires g. Thus, each signal wire group can be protected by two neighboring grounding wires on both sides thereof, and the high frequency transmission characteristics of the whole data transmission cable 100 can be further improved.

In other embodiment of the present invention, in order to correspond with other single-ended signal transmission, the signal wires also define at least one single-ended signal wire. Such as the number of the signal wires is twice as that of the grounding wires, to accommodate Mini SAS (Mini Serial Attached Small Computer System Interface) standard, and in the arrangement direction of the wires 1, two single-ended signal wires are defined on outer sides of the grounding pads, that is to say, two single-ended signal wires are located on both sides of the entire data transmission cable 100, the grounding wires and the signal wire groups are arranged between the two single-ended signal wires in proper sequence.

Furthermore, in another embodiment of present invention, the data transmission cable 100 also can be provided with a plurality of grounding wires and a plurality of single-ended signal wires. Such as the number of the grounding wires is one more than that of the single-ended signal wires, to accommodate narrow version of Mini SAS standard. The specific arrangement is as follows: the two wires 1 on both sides are grounding wires to shield the whole data transmission cable 100 from both sides thereof, and in the arrangement direction of the wires 1, the grounding wires and the signal wires are arranged alternately.

In the present invention, all conductors 11 of the wires 1 have a same outer diameter, and the ratio of the center distance between every two neighboring wires 1 to the outer diameter of the conductor 11 is preferably in the range of 1.4 to 2.8. By this setting, when the wires 1 are provided with differential signal wire groups, the differential impedance of each differential signal wire groups can be effectively reduced and controlled in the range of 75 to 110 Ohm, to enhance coupling effect and ensure long-distance transmission of high frequency signals.

In an optimized embodiment of present invention, the wires 1 define a plurality of differential signal wire groups, according to the setting of the plastic layer 2 and the metallic layer 3, when the ratio of the center distance between two adjacent wires 1 in each differential signal wire group to the outer diameter of the conductor 11 is in the range of 1.4 to 2.8, the differential impedance of the differential signal wire group is in the range of 79 to 106 Ohm.

Specifically, while the ratio of the center distance between two adjacent wires 1 in a same signal wire group to the outer diameter of the conductor 11 is in the range of 1.55 to 2.31, the differential impedance of the wires 1 in each signal wire group can be controlled in the range of 79 to 91 Ohm.

As a preferable embodiment of the present invention, in order to further ensure the softness and lightness of the data transmission cable 100, the conductor 11 has an outer diameter (traditionally expressed in AWG size) in the range of 31 to 33 American Wire Gauge (AWG), at this time, the center distance between two neighboring wires 1 in each signal wire group is defined in the range of 0.28 mm to 0.52 mm, to ensure the differential impedance of the wires 1 in each signal wire group in the range of 79 to 91 Ohm.

Among them, while the outer diameter of the conductor 11 is 31 AWG, the center distance between two neighboring wires 1 in each signal wire group is defined in the range of 0.44 mm to 0.52 mm, to guarantee the differential impedance of the wires 1 in each signal wire group in the range of 79 to 91 Ohm. Specifically, while the center distance between two neighboring wires 1 is 0.48 mm, the differential impedance of the wires 1 in each signal wire group can be controlled with 85 Ohm.

While the outer diameter of the conductor 11 is 32 AWG, the center distance between two neighboring wires 1 in each signal wire group is defined in the range of 0.36 mm to 0.44 mm, to guarantee the differential impedance of the wires 1 in each signal wire group in the range of 79 to 91 Ohm. Specifically, while the center distance between two neighboring wires 1 is 0.40 mm, the differential impedance of the wires 1 in each signal wire group can be controlled with 85 Ohm.

While the outer diameter of the conductor 11 is 33 AWG, the center distance between two neighboring wires 1 in each signal wire group is defined in the range of 0.28 mm to 0.36 mm, to guarantee the differential impedance of the wires 1 in each signal wire group in the range of 79 to 91 Ohm. Specifically, while the center distance between two neighboring wires 1 is 0.32 mm, the differential impedance of the wires 1 in each signal wire group can be controlled with 85 Ohm.

In addition, while the ratio of the center distance between two adjacent wires 1 in a same signal wire group to the outer diameter of the conductor 11 is in the range of 2.18 to 2.84, the differential impedance of the wires 1 in each signal wire group can be controlled in the range of 94 to 106 Ohm.

In an optimized embodiment of present invention, to ensure the softness and lightness of the data transmission cable 100, the outer diameter of the conductor 11 is 33 AWG or 34 AWG, the center distance between two neighboring wires 1 in each signal wire group is defined in the range of 0.35 mm to 0.51 mm, to guarantee the differential impedance of the wires 1 in each signal wire group in the range of 94 to 106 Ohm.

Among them, in present invention, while the outer diameter of the conductor 11 is 33 AWG, the center distance between two neighboring wires 1 in each signal wire group is defined in the range of 0.43 mm to 0.51 mm, to guarantee the differential impedance of the wires 1 in each signal wire group in the range of 94 to 106 Ohm. Specifically, while the center distance between two neighboring wires 1 is 0.48 mm, the differential impedance of the wires 1 in each signal wire group can be controlled with 100 Ohm.

While the outer diameter of the conductor 11 is 34 AWG, the center distance between two neighboring wires 1 in each signal wire group is defined in the range of 0.35 mm to 0.43 mm, to guarantee the differential impedance of the wires 1 in each signal wire group in the range of 94 to 106 Ohm. Specifically, while the center distance between two neighboring wires 1 is 0.40 mm, the differential impedance of the wires 1 in each signal wire group can be controlled with 100 Ohm.

Preferably, each wire 1 has the conductor 11 and the insulative cladding layer 12, and center distance between every two neighboring wires 1 is equal to the outer diameter of the wire 1, that is to say every two neighboring wires 1 are abutting each other, thus it's convenient for forming the data transmission cable 100.

As mentioned, the plastic layer 2 is enclosing on the wires 1 integrally, the metallic layer 3 is formed by a metal belt arranged on an outer side of the plastic layer 2 in a spiral winding way, therefore compact winding and bonding between the metallic layer 3 and the plastic layer 2 can be realized, and an intimate enclosing is formed by the metallic layer 3, on the premise of the data transmission cable 100 having the metallic layer 3 shielding interference, the data transmission cable 100 can be made more thinner and softer, and the overall thickness of the data transmission cable 100 can be controlled in the range of 0.3 mm to 1 mm.

Among them, conjunction with the aforementioned two embodiments, each wire 1 can or cannot have the cladding layer 12. After the wire 1 integrally covered by the plastic layer 2, the overall thickness d2 of the wire 1 and the plastic layer 2 can be controlled in the range of 0.25 mm to 0.8 mm. Combining with the conductor 11 has an outer diameter in the range of 31 to 34 AWG, the overall thickness d2 of the wire 1 and the plastic layer 2 can be controlled in the range of 0.3 mm to 0.6 mm. Furthermore, for example, while the outer diameter of the conductor 11 is 32 AWG, the wire 1 defines the cladding layer 12 with a thickness of 0.1 mm, and the thickness of the plastic layer 2 is 0.07 mm, thus the overall thickness d2 of the wire 1 and the plastic layer 2 can be controlled with 0.54 mm. Certainly, the thickness of the cladding layer 12 and the plastic layer 2 can be adjusted according to actual needs and technical capabilities, and specific settings is not restricted to the conductor 11 with 32 AWG.

In further, the metallic layer 3 in present embodiment has at least an aluminum foil layer 31 and a bonding layer 32 arranged on the side of the aluminum foil layer 31 facing to the plastic layer 2, thus the metallic layer 3 is bonded to the outer side of the plastic layer 2 by the bonding layer 32. By the setting of the aluminum foil layer 31, the external electromagnetic interference can be effectively shielded, the conductors 11 of the signal wire group are effectively isolated from the outside world to ensure the transmission of high frequency or ultra-high frequency signal. In addition, the metallic layer 3 also has fire protection function, which can make the data transmission cable 100 reach horizontal flame retardant grade of FT-2 rating and vertical flame retardant grade of VW-1 rating.

Furthermore, on the one hand, the metallic layer 3 is arranged on an outer side of the plastic layer 2 in a spiral winding way, thus tight winding and bonding between the metallic layer 3 and the plastic layer 2 can be realized. On the premise of guaranteeing shielding and fire protection, the overall volume of the data transmission cable 100 is reduced as much as possible. On the other hand, the bonding layer 32 is arranged on the side of the metallic layer 3 facing to the plastic layer 2, the metallic layer 3 can not only be fixed on the outer side of the plastic layer 2 directly by bonding without a mylar layer, thus the whole of data transmission cable 100 can be made much thinner and much softer. But also air can be discharged when bonding, and as bonding, the discharged air cannot enter again, so as to achieve a dense effect and an intimate enclosing, therefore the data transmission cable 100 can be made more softer and more lightweight with a high frequency transmission performance.

Furthermore, the bonding layer 32 is connecting the plastic layer 2 and the aluminum foil layer 31 by hot melting, to facilitate the setting of the bonding layer 32 and the winding of the metallic layer 3, at the same time, the bonding strength and closeness between the metallic layer 3 and the plastic layer 2 can be increased. The metallic layer 3 further has an insulating layer 36 arranged on the side of the aluminum foil layer 31 deviating from the plastic layer 2, the insulating layer 36 can replace the mylar layer in the prior art, insulate the outside and protect the aluminum foil layer 31 at the same time.

Furthermore, combining with the aforementioned two embodiments, the metallic layer 3 can or cannot have the insulating layer, the whole thickness d1 of the metallic layer 3 is defined in the range of 0.010 mm to 0.055 mm, to minimize the thickness of the data transmission cable 100 on the basis of realizing external shielding. Preferably, the whole thickness d1 of the metallic layer 3 is defined in the range of 0.015 mm to 0.025 mm.

Combining with the setting of the conductor 11, the cladding layer 12, the plastic layer 2 and the thickness of the metallic layer 3, in a preferred embodiment, the thickness of the data transmission cable 100 can be further controlled in the range of 0.35 mm to 0.65 mm. For example, while the outer diameter of the conductor 11 is 32 AWG, the overall thickness d2 of the wire 1 and the plastic layer 2 is about 0.54 mm, and the thickness of the metallic layer 3 is 0.045 mm, thus the thickness of the data transmission cable 100 can be of 0.63 mm Certainly, the thickness of the cladding layer 12, the plastic layer 2 and the metallic layer 3 can be adjusted according to actual needs and technical capabilities, and specific settings is not restricted to above embodiments.

Additionally, the metal belt in a spiral winding way of present invention can be designed as: The width of the metal belt is set as W, in a length direction of the data transmission cable 100, the metal belt is wound with N rings, the data transmission cable 100 has a length L, and the requirement of L<N*W should be satisfied. By winding setting, besides the data transmission cable 100 can be guaranteed with a compact structure and for minimizing the size thereof as much as possible, and have a fire-proof property. And the impedance discontinuity caused by bending can be effectively reduced, thereby ensuring the stability of signal transmission, especially high frequency signal transmission.

Preferably, an overlapping coating area 35 is formed between every two adjacent rings of the metal belt, and the overlapping coating area 35 has a width w along the width direction of the metal belt, the proportion of the width w of the overlapping coating area 35 occupying the width W of the metal belt is 5% to 50%. The width w of the overlapping coating area 35 is at least 0.5 mm, preferably not less than 0.8 mm and optimally 1 mm, thus, the winding continuity of the metallic layer 3 can be effectively guaranteed. When the data transmission cable 100 is bent, cracking phenomenon of the metallic layer 3 can be effectively avoided, thereby effectively avoiding the phenomenon of discontinuous impedance and ensuring the stability of signal transmission, especially high frequency signal transmission.

Further, the winding angle of the metal belt relative to the width direction of the data transmission cable 100 is in the range of 40° to 55°, and preferably 45° to 53°. With the above setting, the flexibility of the data transmission cable 100 in the length direction thereof is more uniform, and it is not easy to cause cracks when bending.

Furthermore, the width W of the metal belt is defined not less than half of the whole width of the data transmission cable 100, preferably not less than 0.75 times of the whole width of the data transmission cable 100, optimally not less than one times of the whole width of the data transmission cable 100. With the above setting of the width W, the winding of the metal belt is more convenient and the compactness of the winding can be controlled conveniently, and at the same time, the softness of the entire data transmission cable 100 after winding can be guaranteed. Additionally, the overlapping area of the entire data transmission cable 100 at per unit length can be less, thereby further reducing the possibility of the metal belt spreading when bending.

Further, it is assumed that there is a center distance d0 between two adjacent wires 1 in the present invention, the number of the wires 1 is n, the whole width of the data transmission cable 100 is defined in the range of d0*n to d0*(n+2). The ratio of the whole width of the data transmission cable 100 to n is 1 to 1.25 times of the width, thus it ensures that the plastic layer 2 with a certain width still can be defined on both outer sides of wires 1 in the width direction of the data transmission cable 100, but the plastic layer 2 on both sides of the data transmission cable 100 in the width direction will not be too large to increase the whole width of the data transmission cable 100, thus an effective protection for the wires 1 can be realized as the plastic layer 2 having a minimal size.

With the above configuration, the weight of per centimeter as a unit length of the data transmission cable 100 is in the range of 0.015 g to 0.30 g. Moreover, in the case of per centimeter as a unit length, the ratio of the weight of the data transmission cable 100 to the number of wires 1 is in the range of 0.0080 to 0.0020. Therefore, the data transmission cable 100 is not only flexible with higher frequency stability, but also more portable.

Figure 5:
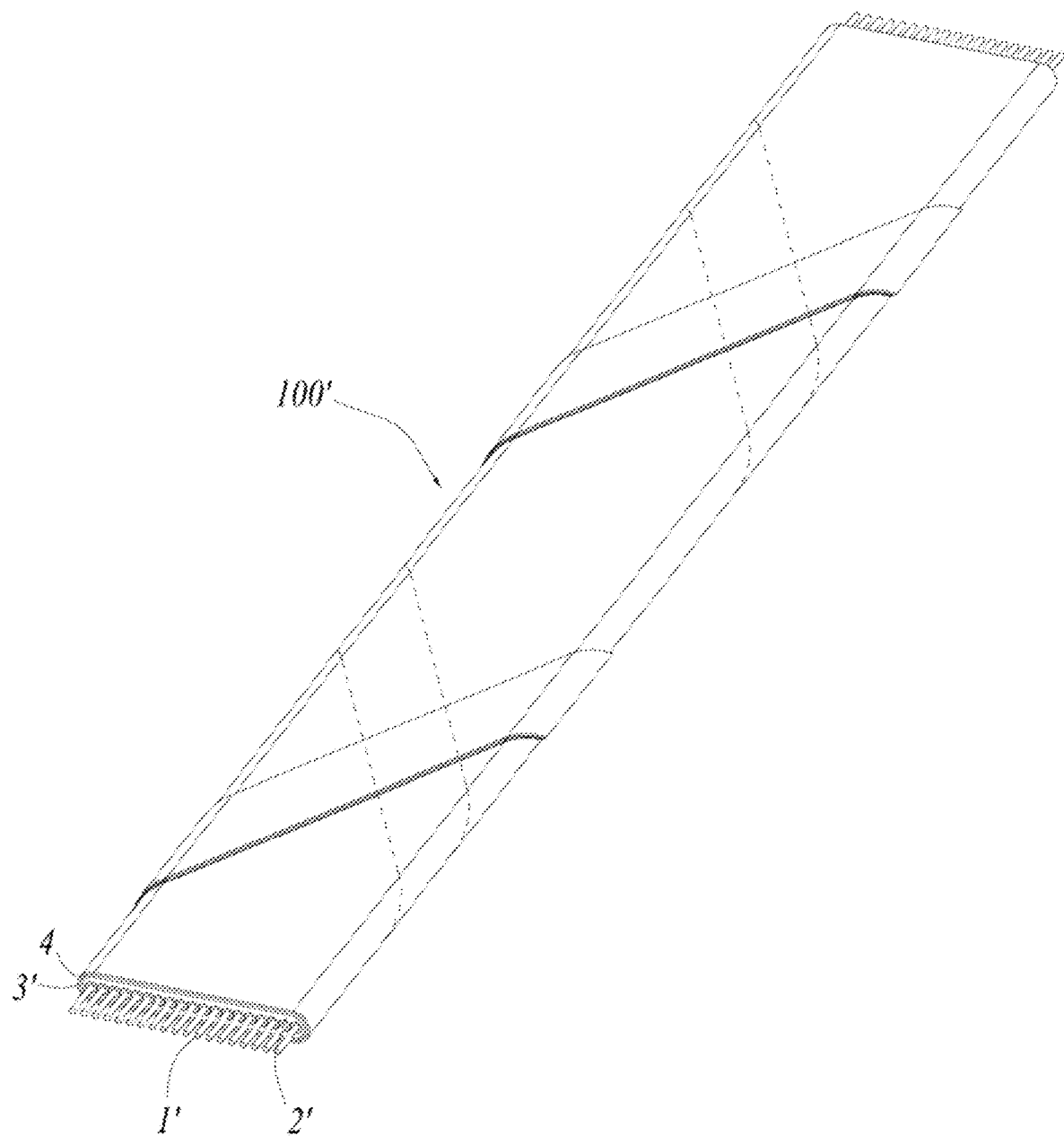
FIG. 5 is a perspective view of a data transmission cable in accordance with a third embodiment of the present disclosure.
Figure 6:
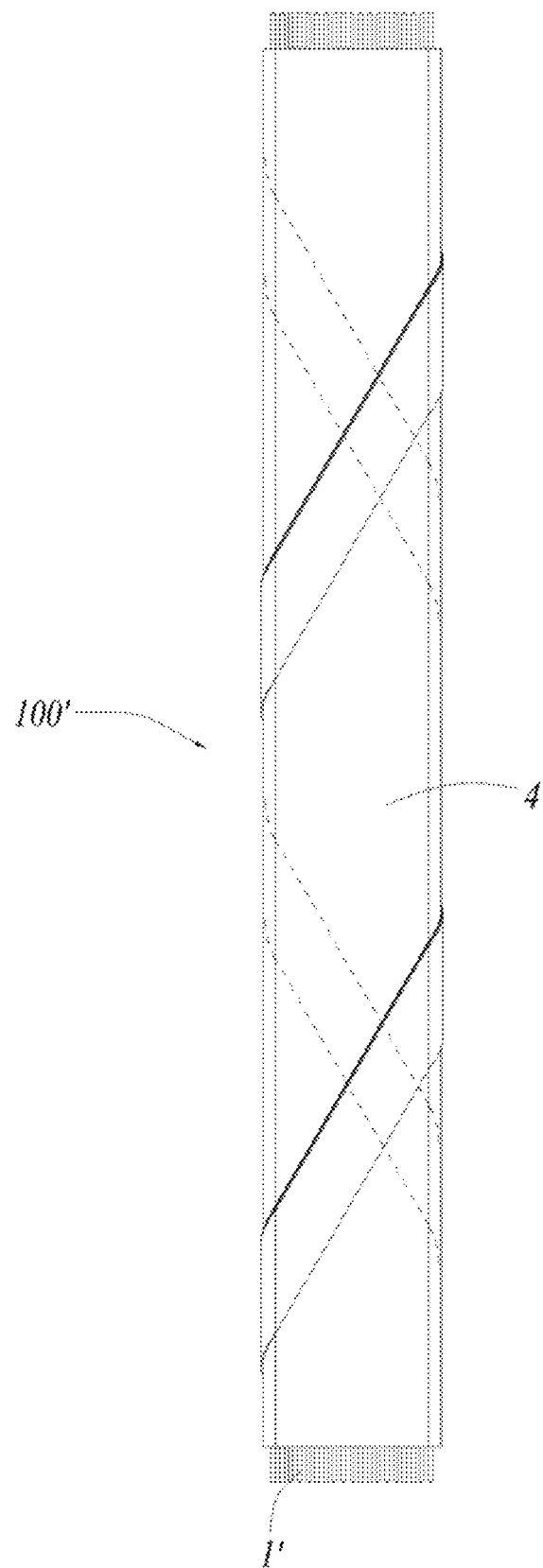
FIG. 6 is a top view of the data transmission cable shown in FIG. 5.
Figure 7:
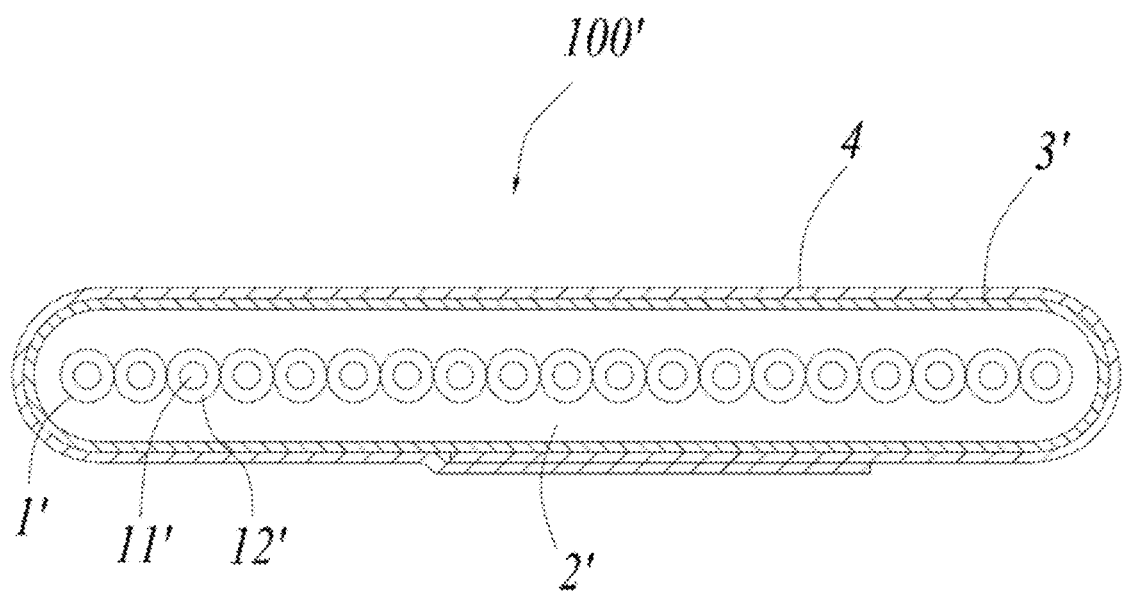
FIG. 7 is a front view of the data transmission cable shown in FIG. 5.

FIGS. 5 to 7 illustrate a data transmission cable 100' according to a third embodiment of the present invention, compared with the first embodiment described above, the data transmission cable 100' further includes a mylar layer 4 coated on the outside of the metallic layer 3'.

With the above configuration, the metallic layer 3' can only have the aluminum foil layer, also can have the aluminum foil layer and the bonding layer same as the first embodiment, and further can have the insulating layer, thus, an encapsulation compaction effect of the metallic layer 3' can be guaranteed further by the mylar layer 4.

Additionally, in the present embodiment, the mylar layer 4 is also defined in a spiral winding way, and adhesive glue is arranged on the side of the mylar layer 4 facing the metallic layer 3'. The mylar layer 4 is fixed to the outer side of the metallic layer 3' by the adhesive glue after hot melting, thereby ensuring the coating effect of the mylar layer 4 as compact as that of the metallic layer 3'. Preferably, the mylar layer 4 and the metallic layer 3' are defined in a cross-winding way, to guarantee the winding of the metallic layer 3', and further reduce or avoid the phenomenon of impedance discontinuity, for guaranteeing the stability of signal transmission.

Figure 8:
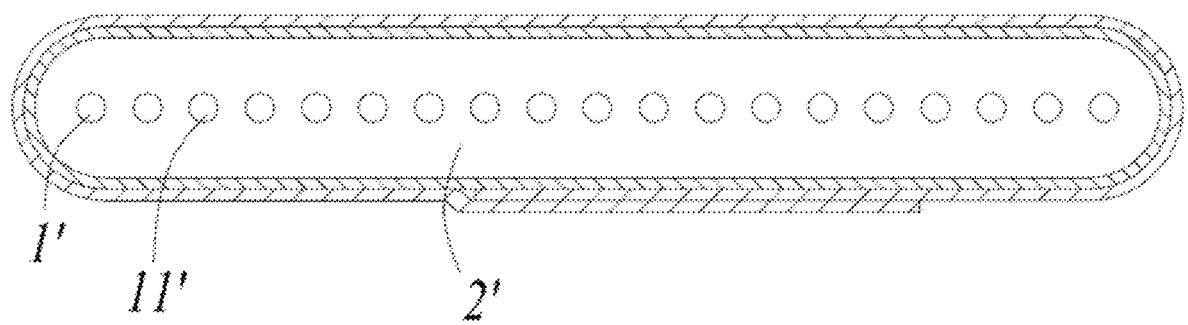
FIG. 8 is a perspective view of a data transmission cable in accordance with a fourth embodiment of the present disclosure.

Additionally, a fourth embodiment is shown in FIG. 8, the data transmission cable has a similar configuration as the third embodiment shown in FIG. 7, the difference is that the wire 1' is defined without the cladding layer 12', that is to say, the plastic layer 2' is directly enclosing on the conductors 11 of the wires, which also can achieve the purpose of the present invention.

Figure 9A:
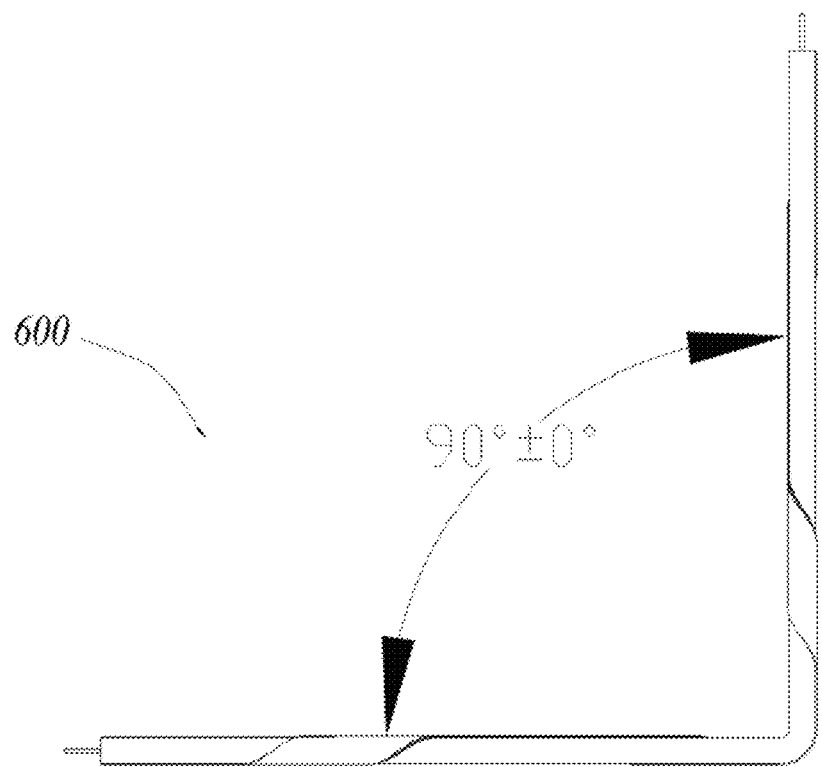
FIG. 9*a* and FIG. 9*b* are side views of a partial structure of the data transmission cable in accordance with a fifth embodiment of the present disclosure.
Figure 9B:
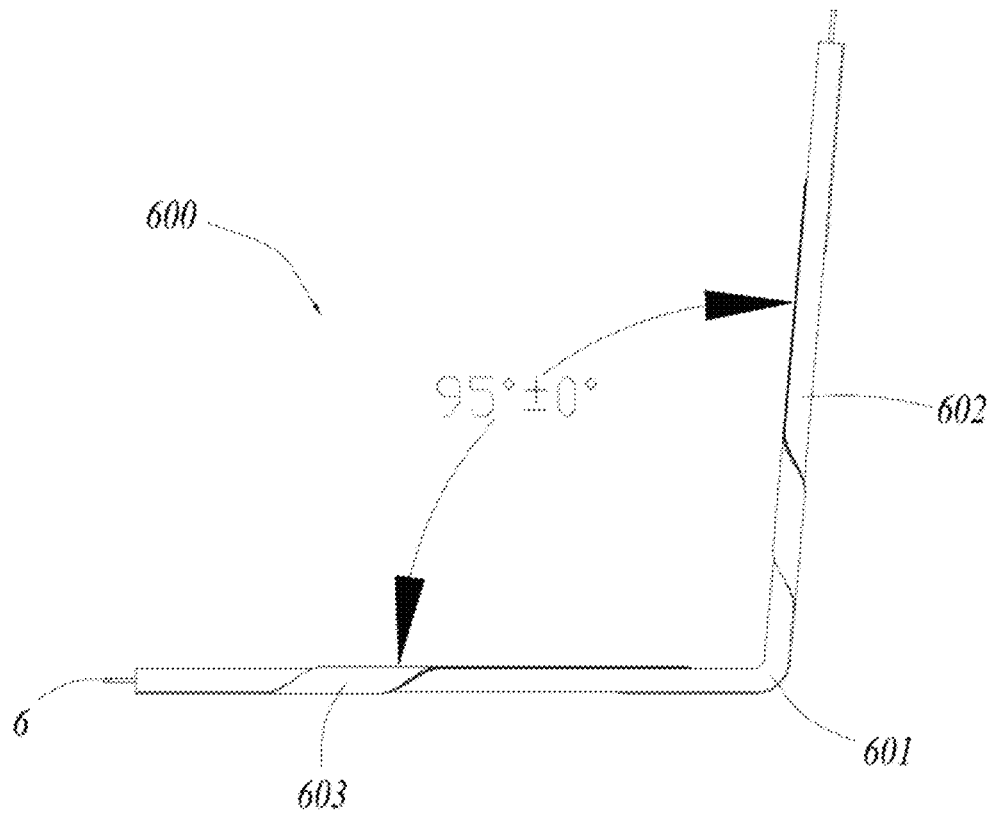
Figure 10:
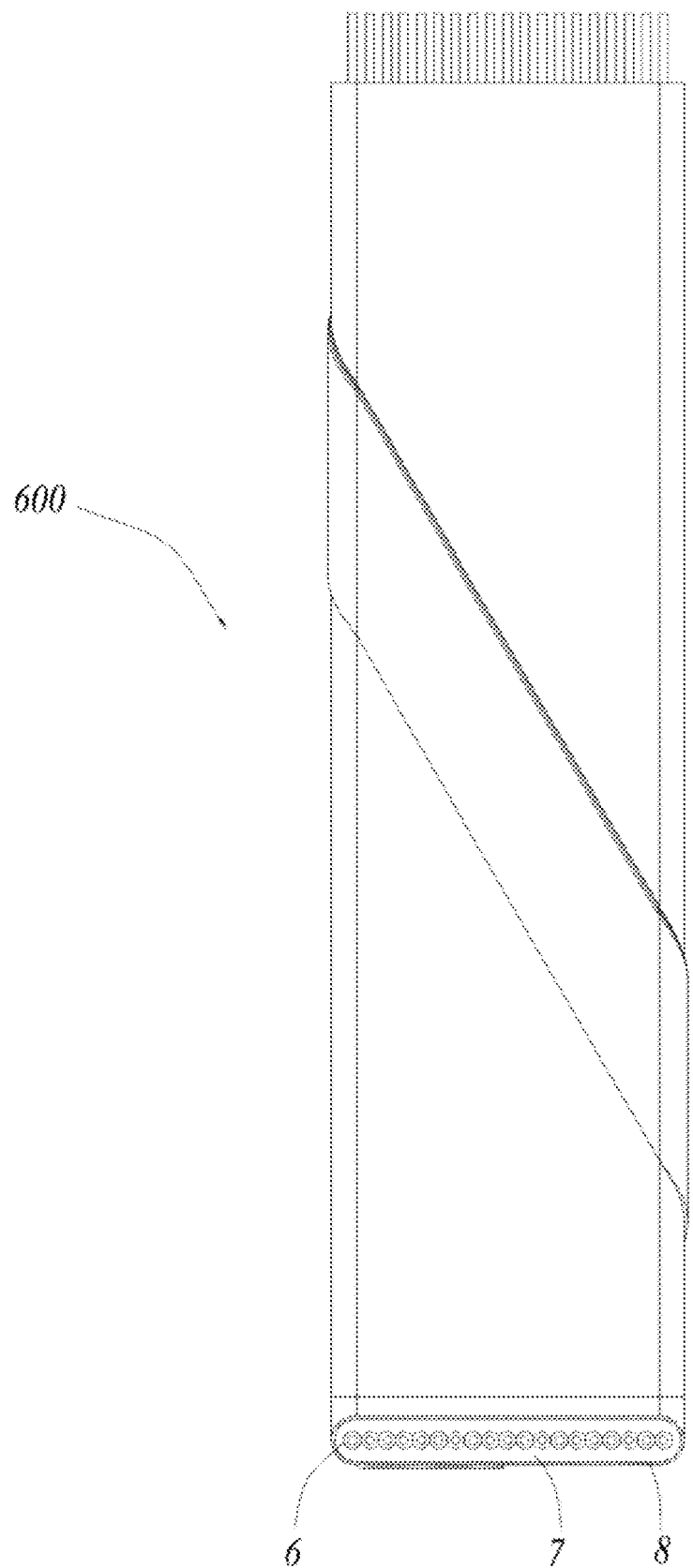
FIG. 10 is a front view of the data transmission cable shown in FIG. 9*b*.

Referring to FIGS. 9a, 9b and 10, similar as the setting of the data transmission cable 100, 100', a data transmission cable 600 comprises a plurality of juxtaposed wires 6, a plastic layer 7 enclosing on the wires 6 integrally and a metallic layer 8 formed by a metal material belt arranged on an outer side of the plastic layer 7 in a spiral winding way.

Further, in the length direction of the data transmission cable 600, the data transmission cable 600 has at least one bending portion 601, thus the data transmission cable 600 is formed with a first section 602 and a second section 603 on both sides of the bending portion 601, and a stable bending angle is formed between the first section 602 and the second section 603.

As aforementioned, on the one hand, by the wires 6 of the data transmission cable 600 being arranged abreast with the plastic layer 7 enclosing on the outer side of the wires 6 integrally, thus the thickness of the whole data transmission cable 600 can be thinner. On the other hand, the metal belt is spirally wound on the outer side of the plastic layer 7 to realize the close winding and bonding between the metallic layer 8 and the plastic layer 7, and the coating of the metallic layer 8 is more compact, the data transmission cable 600 can be made thinner and softer under the premise of the metallic layer 8 shielding interference. Combining with the above two points, the data transmission cable 600 can be bent with a stable bending angle without an auxiliary tool, it is convenient for installation and connection in subsequent equipment.

The data transmission cable 600 is bending at a predetermined bending angle to form the bending portion, by above setting of the plastic layer 7 and the metallic layer 8, the difference between the stable bending angle after bending and the predetermined bending angle can be less than 10 degrees. Comparison between FIG. 9a and FIG. 9b, when the predetermined bending angle is 90 degrees, the practical bending angle shown in FIG. 9b is 5 degrees larger than the predetermined bending angle in FIG. 9a. In the figures, only one bending portion with bending at 90 degrees is shown simply by illustration, in practical use, various angles and/or multiple bending portions can be carried out according to requirements.

Figure 11A:
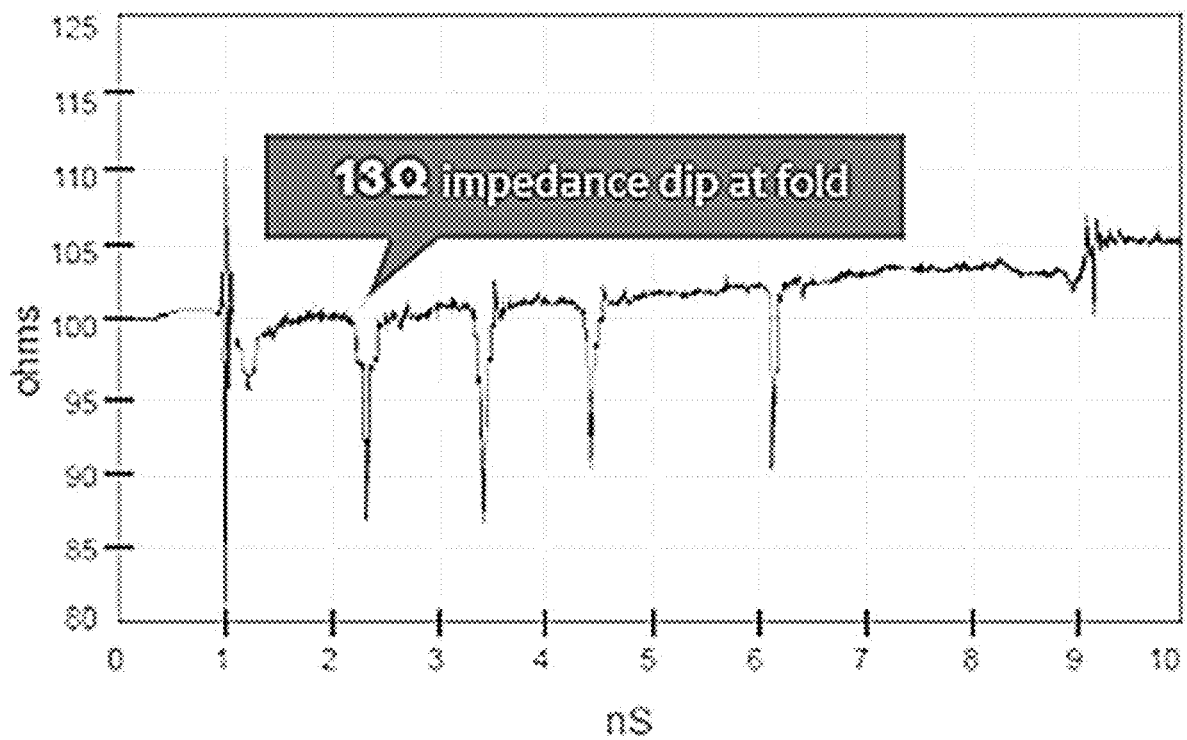
FIG. 11*a* is an impedance change diagram of a traditional data transmission cable after bending.
Figure 11B:
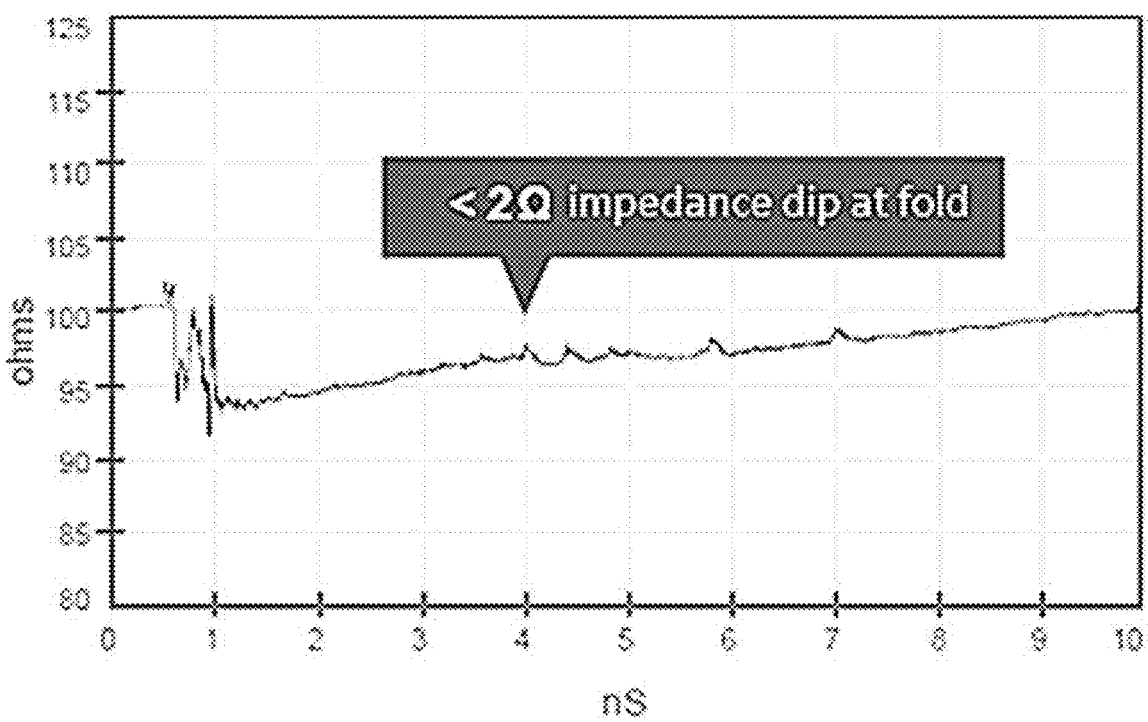
FIG. 11*b* is an impedance change diagram of the data transmission cable shown in FIG. 9*b*.

Additionally, an impedance change diagram of a traditional data transmission cable after bending is shown in FIG. 11a, we can see the impedance change at the bending portion is about 13 Ohm; FIG. 11b is a testing schematic diagram of the data transmission cable 600 in a better embodiment of the present disclosure, the data transmission cable 600 has multiple bending portions, be seen From FIG. 11b, a small fluctuation is found at some locations during the test, which are the bending positions of the data transmission cable 600. However, it can be seen that the average impedance change of the data transmission cable 600 of the present invention at least once mentioned above is not greater than 2 Ohm, in other words, the difference between the average impedance of the data transmission cable 600 with at least one bending portion and the predetermined impedance of the data transmission cable is not greater than 2 Ohm. Specially, the impedance change of the data transmission cable 600 at each bending portion is not greater than 2 Ohm, that is to say, the difference between the impedance of the data transmission cable 600 at each bending portion and the predetermined impedance is not greater than 2 Ohm.

Additionally, after testing, signal delay of the data transmission cable 600 with the bending portions is not greater than 5 picoseconds per unit length.

Figure 12:
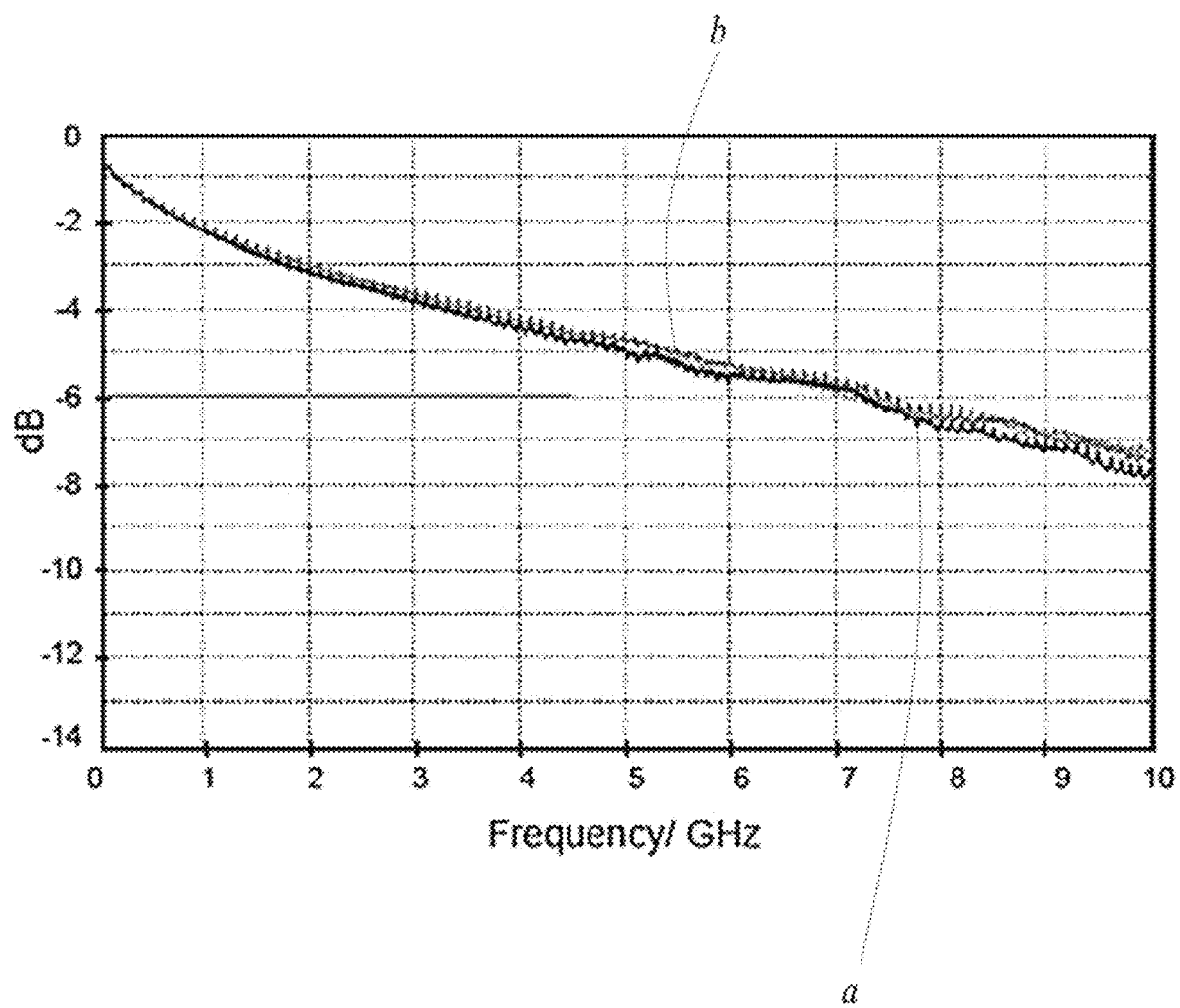
FIG. 12 is an insertion loss diagram of the data transmission cable shown in FIG. 9*b* as bending and revoking bending.

Referring to FIG. 12, insertion loss of the data transmission cable 600 after bending in signal transmission is shown, curve a shows the signal transmission loss of the data transmission cable 600 as revoking bending, curve b shows the signal transmission loss of the data transmission cable 600 as bending. From the comparison of the curves, at the same frequency, the insertion loss of the data transmission cable 600 after bending compared with revoking bending, the difference therebetween is less than 10%. Moreover, the difference between the reflection loss of the data transmission cable 600 after bending and that of revoking bending is less than 10%.

Preferably, the setting of the metallic layer 8 is same as the first embodiment shown in FIG. 1, and the metallic layer 8 has a bonding layer and an insulating layer, the bonding strength between the metallic layer 8 and the plastic layer 7 can be increased, and the aluminum foil layer can be protected, thereby improving the above properties.

Furthermore, the data transmission cable 600 further has the mylar layer as shown in FIGS. 5 to 8, to strengthen the protection for the outer metallic layer 8.

In addition, the relevant settings in the other embodiments described above are also basically applicable to the present embodiment. For example, the wires 6 in present embodiment are disposed same as the aforementioned embodiment, preferably in the arrangement direction of the wires 6, the wires 6 define a plurality of grounding wires and a pair of signal wires between every two neighboring grounding wires, and the pair of signal wires constitute a signal wire group. The wires 6 are disposed in an equally spaced arrangement, and all the conductors of the wires 6 have a same outer diameter, the other similar description is omitted here.

It is to be understood, however, that even though numerous characteristics and advantages of preferred and exemplary embodiments have been set out in the foregoing description, together with details of the structures and functions of the embodiments, the disclosure is illustrative only; and that changes may be made in detail within the principles of present disclosure to the full extent indicated by the broadest general meaning of the terms in which the appended claims are expressed.

What is claimed is:

1. A flat data transmission cable, comprising:
   a plurality of juxtaposed wires, and each wire having a conductor;
   a plastic layer enclosing on the wires integrally;
   a metallic layer formed by a metal material belt arranged on an outer side of the plastic layer in a spiral winding way;
   wherein the metallic layer has at least an aluminum foil layer and a bonding layer arranged on the side of the aluminum foil layer facing to the plastic layer, the metallic layer is bonded to the outer side of the plastic layer by the bonding layer, the metal belt has a width W, in a length direction of the data transmission cable, the metal belt is wound with N rings, the data transmission cable has a length L, and the requirement of L<N*W is satisfied, an overlapping coating area is formed between every two adjacent rings of the metal belt, and the overlapping coating area has a width w along the width direction of the metal belt, the proportion of the width w of the overlapping coating area occupying the width W of the metal belt is 5% to 50%.

2. The flat data transmission cable as claimed in claim 1, wherein the bonding layer is attached to the outer side of the plastic layer by hot melting, the metallic layer further has an insulating layer arranged on the side of the aluminum foil layer deviating from the plastic layer.

3. The flat data transmission cable as claimed in claim 2, wherein the whole thickness of the metallic layer is defined in the range of 0.010 mm to 0.055 mm.

4. The flat data transmission cable as claimed in claim 1, wherein the width W of the metal belt is defined not less than half of the whole width of the data transmission cable.

5. The flat data transmission cable as claimed in claim 1, wherein the winding angle of the metal belt relative to the width direction of the data transmission cable is in the range of 40° to 55°.

6. The flat data transmission cable as claimed in claim 1, wherein each wire has an insulative cladding layer enclosing on the conductor.

7. The flat data transmission cable as claimed in claim 6, wherein in the thickness direction of the data transmission cable, the distance between the outer edge of the conductor and the outer edge of the plastic layer is in the range of 0.1 mm to 0.45 mm.

8. The flat data transmission cable as claimed in claim 6, wherein each conductor has an outer diameter in the range of 31 to 34 AWG, and the ratio of the center distance between every two neighboring wires out of the plurality of wires to the outer diameter of the conductor is in the range of 1.4 to 2.8.

9. The flat data transmission cable as claimed in claim 8, wherein the overall thickness of the data transmission cable is in the range of 0.3 mm to 1 mm.

10. The flat data transmission cable as claimed in claim 8, wherein the wires are disposed in an equally spaced arrangement, and the outer diameter of the wire is equal to the center distance between the every two neighboring wires.

11. The flat data transmission cable as claimed in claim 6, wherein the cladding layer is made of same kind material as the plastic layer.

12. The flat data transmission cable as claimed in claim 1, wherein the wires are disposed in an equally spaced arrangement, there is a center distance d0 between two adjacent wires, the number of the wires is n, the whole width of the data transmission cable is defined in the range of d0*n to d0*(n+2).

13. The flat data transmission cable as claimed in claim 1, wherein in the case of per centimeter as a unit length, the ratio of the weight of the data transmission cable to the number of wires is in the range of 0.0080 to 0.0020 g/cm/wire.

14. The flat data transmission cable as claimed in claim 1, wherein the data transmission cable further includes a mylar layer coated on the outside of the metallic layer in a spiral winding way, and the mylar layer and the metallic layer are defined in a cross-winding way.

15. The flat data transmission cable as claimed in claim 1, wherein the data transmission cable has a horizontal flame retardant grade of FT-2 rating.

16. A flat data transmission cable, comprising:
a plurality of juxtaposed wires, and each wire having a conductor;
a plastic layer enclosing on the wires integrally;
a metallic layer formed by a metal material belt arranged on an outer side of the plastic layer in a spiral winding way;
wherein the metallic layer has at least an aluminum foil layer and a bonding layer arranged on the side of the aluminum foil layer facing to the plastic layer, the metallic layer is bonded to the outer side of the plastic layer by the bonding layer, the wires are disposed in an equally spaced arrangement, there is a center distance d0 between two adjacent wires, the number of the wires is n, the whole width of the data transmission cable is defined in the range of d0*n to d0*(n+2).

17. A flat data transmission cable, comprising:
a plurality of juxtaposed wires, and each wire having a conductor;
a plastic layer enclosing on the wires integrally;
a metallic layer formed by a metal material belt arranged on an outer side of the plastic layer in a spiral winding way;
wherein the metallic layer has at least an aluminum foil layer and a bonding layer arranged on the side of the aluminum foil layer facing to the plastic layer, the metallic layer is bonded to the outer side of the plastic layer by the bonding layer, in the case of per centimeter as a unit length, the ratio of the weight of the data transmission cable to the number of wires is in the range of 0.0080 to 0.0020 g/cm/wire.

* * * * *